United States Patent [19]

Van Steenbergen et al.

[11] 3,777,228

[45] Dec. 4, 1973

[54] SCHOTTKY JUNCTION IN A CAVITY

[75] Inventors: Teunis Willem Van Steenbergen, Hilversum; Jan Arie Gerrit De Waal, Emmasingel, Eindhoven, both of Netherlands

[73] Assignee: U.S. Philips Corporation, New York, N.Y.

[22] Filed: Nov. 14, 1969

[21] Appl. No.: 876,758

[30] Foreign Application Priority Data

Nov. 19, 1968 Netherlands ...................... 6816449

[52] U.S. Cl. . 317/235 R, 317/235 UA, 317/235 M, 317/235 AJ, 317/234 R

[51] Int. Cl. ........................ H01l 11/00, H01l 15/00

[58] Field of Search ........................ 317/235, 24, 31, 317/26, 39, 47

[56] References Cited

UNITED STATES PATENTS

| | | | |
|---|---|---|---|
| 3,322,581 | 5/1967 | Hendrickson et al. | 148/175 |
| 3,500,144 | 3/1970 | Wetterau et al. | 317/236 |
| 3,443,041 | 5/1969 | Kahng et al. | 317/234 |
| 3,514,346 | 5/1970 | Cray | 317/235 |
| 3,585,469 | 6/1971 | Jager | 317/234 |
| 3,564,309 | 2/1971 | Hoeberechts et al. | 313/66 |

OTHER PUBLICATIONS

IBM Technical Disclosure Bulletin, Schottky Barrier Diode, by Stiles, Vol. 11, No. 1, June 1968 page 20.

*Primary Examiner*—John W. Huckert
*Assistant Examiner*—Andrew J. James
*Attorney*—Frank R. Trifari

[57] ABSTRACT

The invention relates to a method of manufacturing a semiconductor device having a schottky junction, for example, a schottky diode, in which a masking layer which is provided with a window is provided on a semiconductor body and at the area of the window a cavity extending to below the masking layer is provided in but not through said semiconductor body, the schottky electrode layer which extends to below the masking layer but not up to the masking layer being provided in said cavity by vapour-deposition or sputtering. The invention also relates to a semiconductor device manufactured by said method. A pressure contact is preferably provided on the schottky electrode layer.

4 Claims, 3 Drawing Figures

Figure 1:
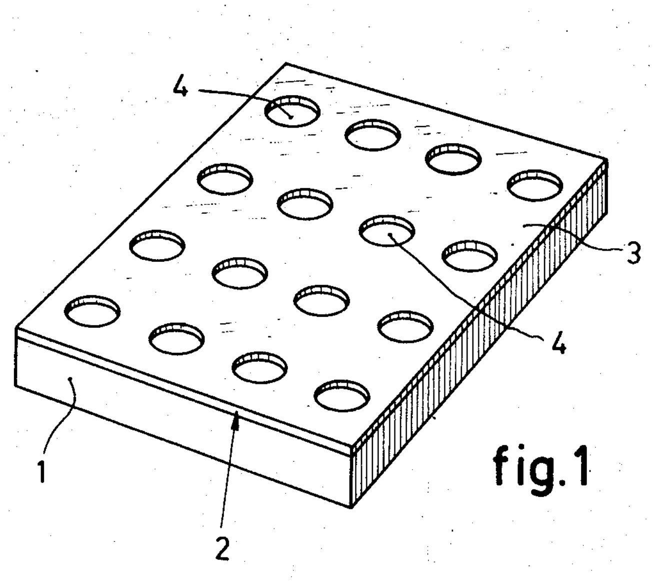

INVENTORS
TEUNIS W. VAN STEENBERGEN
JAN A.G. DE WAAL
BY
AGENT

SCHOTTKY JUNCTION IN A CAVITY

The invention relates to a method of manufacturing a semiconductor device having a schottky junction. The device includes a semiconductor body of one conductivity type, a masking layer which comprises a window on a surface of the semiconductor body, and a schottky electrode layer on a surface part accessible through the window.

A schottky electrode layer is a metal layer, whereas a schottky junction is a metal semiconductor junction. However, a schottky electrode may contain, for example, semiconductor material in addition to metal. Furthermore, a thin insulating layer, for example, a natural oxide layer having a thickness of, for example, a few tens of A may be present between the schottky electrode layer and the semiconductor body. An additional metal layer or additional metal layers may be provided on the schottky electrode layer, for example, to improve the electric connection with a connection conductor.

A semiconductor device having a schottky junction may be a schottky diode which can be used, for example, as a mixing diode, a switching diode or a varactor diode. Furthermore, such a semiconductor device may be, for example, a transistor in which the schottky junction forms the collector junction.

A method of the above-mentioned type is described by D.T. Young and J.C. Irvin in Proc. of the I. E. E. E. December, 1965, pp. 2130 – 2131. A very important advantage of this method is that the schottky electrode layer is obtained as a thin layer in a window of a masking layer. As a result of this the schottky electrode layer can be contacted in a very simple manner by means of a pressure contact. This pressure contact, for example, in the form of a pointed wire, can be moved over the masking layer with one end until it lodges in the window. This method of contacting can even be facilitated by providing a large number of windows with an electrode layer in each window.

The breakdown voltage of a schottky junction obtained according to the known method is found to be comparatively low. The breakdown voltage of the known schottky junction is usually not more than about 10 volts. However, a considerably higher breakdown voltage is often desirable for various uses, for example, of a schottky junction in a switching diode.

It is the object of the invention to provide a method of the type described above in which schottky junctions are obtained having a breakdown voltage which is considerably higher than 10 volts.

The invention is based on the recognition of the fact that a higher breakdown voltage can be obtained in a simple manner by providing the schottky electrode layer in a cavity in the semiconductor body.

According to the invention, a method of the type mentioned in the preamble is characterized in that after providing the masking layer, the surface of the part in the window is subjected to a treatment for removing material so as to obtain a cavity in but not through the part, said cavity extending laterally to below the masking layer, the schottky electrode layer, with a thickness smaller than the depth of the cavity, being formed in the cavity by vapour-depositing electrode material in a vacuum, electrode material being also deposited on the masking layer to form a conductive layer therein which is insulated from the schottky electrode layer as a result of the shadow effect during the vapour deposition of the masking layer. In this manner, schottky junctions having breakdown voltages of approximately 20 to 35 volts have been obtained on silicon having a resistivity of from 0.6 to 0.8 ohm. cm.

The reason for the high breakdown voltages obtained is not understood. The schottky electrode layer is found to extend to below the masking layer, but not up to the edge of the cavity, said edge adjoining the masking layer. The part of the schottky electrode layer situated below the oxide layer probably has a decreasing thickness and hence a large resistance which reduces the influence of effects at the edge of the electrode layer which usually reduce the breakdown voltage. It is also possible that the masking layer, if it adjoins a schottky junction, has an unfavourable influence on the breakdown voltage of the junction, while said unfavourable influence is avoided by using the method according to the invention, since a schottky electrode layer is obtained which does not extend up to the masking layer. It is also possible that a sharp curve of the depletion layer occurring during operation near the edge of the schottky electrode layer is avoided.

It is to be noted that the vapor deposition of electrode material is to be understood to mean not only the vaporization and then deposition of electrode material, but also the provision of electrode material by sputtering.

The schottky electrode layer is preferably provided with a pressure contact which can be provided in a manner as has been described with respect to the known method.

The conductive layer on the masking layer may be used as a screening layer which screens the pressure contact capacitively from the semiconductor body. When this screening is not necessary, the conductive layer on the masking layer is preferably removed to avoid a shortcircuit between the pressure contact and the conductive layer.

During providing a pressure contact, the masking layer prevents damage of the edge of the schottky electrode layer. Furthermore, the masking layer permits of obtaining an electric signal during the operation of locating a pressure contact. When the pressure contact is moved over the masking layer and a potential difference is maintained between the pressure contact and the semiconductor body, no current can flow through the pressure contact. When the pressure contact reaches a schottky electrode layer, current can flow and thus provide an indication of a schottky electrode layer being reached. When the quality of this electrode layer turns out to be unsatisfactorily, the pressure contact may be moved further over the masking layer until a following schottky electrode layer is reached. This electric indication is of importance inter alia for automated mass manufacture. However, it is possible to remove the masking layer. The properties of the schottky junction are not adversely influenced by this.

It is to be noted that conventional masking layers, such as silicon oxide and silicon nitride, are electric insulators.

Preferably a cavity is provided having a depth exceeding 1 $\mu m$ and a schottky electrode layer having a thickness smaller than 1 $\mu m$.

In order to reduce the electric resistance of the semiconductor body, the cavity is preferably provided in an epitaxial semiconductor layer which is provided on a semiconductor substrate which is of the same conductivity type as, but has a lower resistivity than, the epitaxial layer. When the epitaxial layer is chosen to be thin so that with an increasing voltage in the reverse direction across the schottky junction, the depletion layer occurring expands over the whole thickness of the epitaxial layer, after which the thickness of said depletion layer remains substantially constant as a result of the higher doping of the substrate and the depletion layer expands only laterally in the epitaxial layer, then the breakdown voltage is determined by the thickness of the epitaxial layer. A structure having such a thin epitaxial layer may advantageously be used as an avalanche diode.

The invention furthermore relates to a semiconductor device having a schottky junction manufactured by using a method according to the invention.

An important embodiment of a semiconductor device having a schottky junction comprising a semiconductor body of the one conductivity type on the surface of which a masking layer with a window is provided, while a part of the body is provided with a schottky electrode layer at the area of the window, according to the invention, is characterized in that at the area of the window a cavity extends from the surface in but not through the part, said cavity extending laterally to below the masking layer, the schottky electrode layer which has a thickness smaller than the depth of the cavity being provided entirely in the cavity and extending to below the masking layer but not up to the masking layer.

The schottky electrode layer is preferably provided with a pressure contact.

Figure 2:
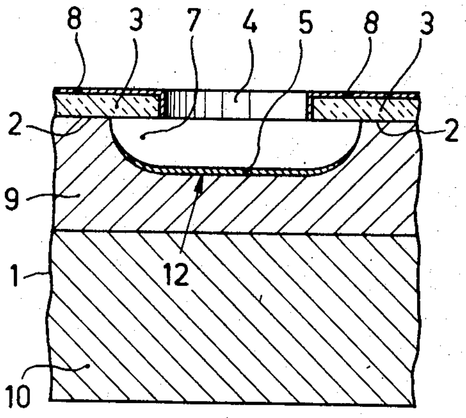
Figure 3:
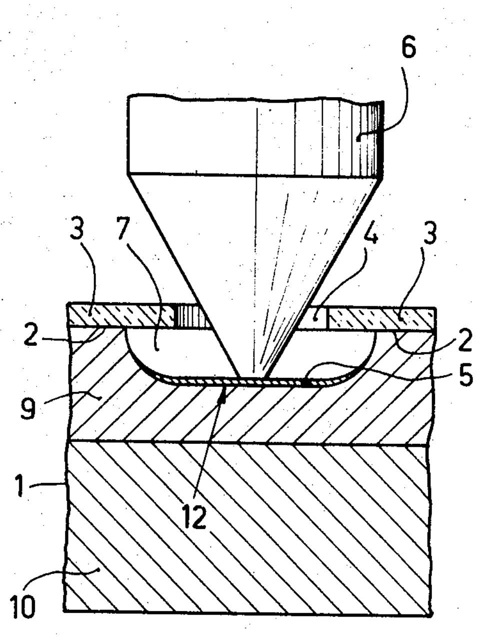

In order that the invention may be readily carried into effect, one embodiment thereof will now be described in greater detail, by way of example, with reference to the accompanying drawing, in which, FIG. 1 is a diagrammatic perspective view of a semiconductor body comprising a masking layer with windows;

FIG. 2 is a diagrammatic cross-sectional view of a part of the semiconductor body shown in FIG. 1 after it has been subjected to a few treatments for the manufacture of a schottky diode according to the invention; and FIG. 3 is the same diagrammatic cross-sectional view after the schottky diode according to the invention has been provided with a pressure contact.

One embodiment of a method according to the invention will now be described with reference to FIGS. 1 to 3 for manufacturing a semiconductor device having a schottky junction 12 in the form of a schottky diode, in which a masking layer 3 which comprises windows 4 is provided on a surface 2 of a semiconductor body 1 of the one conductivity type after which a schottky electrode layer 5 is provided at the area of the windows 4.

The semiconductor body 1 shown in FIG. 1 is destined for one diode. The masking layer 3 is provided with a number of windows to facilitate the provision of a pressure contact 6 as described above. The number of windows may be smaller or larger than is shown in FIG. 1.

In practice the starting material will usually be a larger semiconductor body so as to manufacture a number of diodes simultaneously. After providing the pressure contact 6, the semiconductor body is then subdivided in the conventional manner so as to obtain semiconductor bodies each destined for one diode.

According to the invention, after providing the masking layer 3 the surface of the semiconductor body 1 in the windows 4 is subjected to a treatment for removing material so as to obtain cavities 7 of which one is shown in FIGS. 2 and 3. This cavity 7 extends laterally to below the masking layer 3. A schottky electrode layer 5 having a thickness smaller than the depth of the cavity 7 is provided in the cavity 7 by vapour-depositing electrode material in a vacuum. Electrode material is also deposited on the masking layer 3 and forms there the conductive layer 8. Due to the shadow effect of the masking layer 3 during the vapour deposition, layer 8 is insulated from the schottky electrode layer 5.

The semiconductor body 1 consists of silicon and has dimensions of approximately 120 $\mu$m × 700 $\mu$m × 700 $\mu$m. The body comprises an epitaxial *n*-type silicon layer 9 having a thickness of from 5 to 6 $\mu$m and a resistivity of approximately 0.8 ohm. cm. This layer 9 is provided on the *n*-type silicon substrate 10 which has a lower resistivity than the layer 9, for example, a resistivity of 0.01 ohm.cm.

The masking layer 3 consists of silicon oxide and has a thickness of 0.3 $\mu$m. This layer is provided in any conventional manner and provided in normal manner with the circular windows 4 which have a diameter of 4 $\mu$m.

The cavity 7 is provided in the epitaxial layer 9 by etching, an etchant being used which etches silicon more rapidly than silicon oxide. The etchant consists, for example, of 1 part of hydrofluoric acid (40 percent), in 20 parts of nitric acid (65 percent). Etching is preferably continued until the cavity has a depth larger than 1 $\mu$. The cavity 7 has a depth of from 2 to 3 $\mu$m.

The schottky electrode layer 5 and the conductive layer 8 are obtained by vapor depositing nickel. These layers preferably have a thickness smaller than 1 $\mu$m and in the present example have a thickness of approximately 0.1 to 0.2 $\mu$m. The vapour-deposition in a vacuum can be carried out in any conventional manner. Since a conventional vaporization source is larger than the windows 4 the resulting electrode layer 5 will extend to below the masking layer 3 but the shadow effect of the layer 3 prevents the layers 8 and 5 from forming one assembly.

If it should be desirable to maintain the conductive layer 8, for example, for capacitive screening, the pressure contact may then be provided. If the capacitive screening should not be necessary, the layer 8 is removed in any conventional manner. It is of no importance when small parts of the layer 8 adjoining a window 4 are not removed. As a result of removing layer 8, the possibility of shortcircuit between the pressure contact to be provided and the layer 8, and a large increase of the capacity between the pressure contact and the semiconductor body is avoided. In FIG. 3 the layer 8 is removed.

A pressure contact 6 consisting of a molybdenum wire having a diameter of approximately 100 $\mu$ and a tapering end is moved with the end over the masking layer 3 until the wire lodges in a cavity 7. By measurements, it is found out whether the diode has good characteristics. If this should not be the case, the pressure contact 6 is again moved over the layer 3, until the contact lodges in another cavity. When good characteristics are obtained, the diode can be assembled in any conventional manner and provided with an envelope.

The resulting schottky diode according to the invention shows a breakdown voltage of approximately 30 volts, while a schottky diode without cavity, but otherwise manufactured in the same manner, has a breakdown voltage of only approximately 10 volts. So, in addition to the advantage that the pressure contact can be provided in a simple manner, a schottky diode according to the invention has the advantage of a high breakdown voltage.

Before providing the pressure contact 6, an additional metal layer can be provided on the electrode layer 5, and may serve to obtain a better electric contact with the pressure contact 6. For example, a layer of gold can be provided on the electrode layer 5 by vapour-deposition in a vacuum.

The masking layer 3 may be removed, if desirable, as well as the conductive layer 8.

It is to be noted that the substrate 10 must be provided with a connection contact which can be provided in any conventional manner, preferably immediately after providing the layer 3.

It will be obvious that the invention is not restricted to the examples described and that many variations are possible to those skilled in the art without departing from the scope of this invention. The diameter of the windows 4 need not be 40 $\mu$m and may be smaller or larger. Furthermore, one window per diode will be sufficient. The cavity may have a depth larger than that mentioned, for example, a depth of 10 $\mu$m. Generally, a larger depth provides a slightly larger breakdown voltage. The thickness of the epitaxial layer below the schottky electrode layer is usually chosen to be approximately so large that during operation the depletion layer which is formed at the schottky junction does not reach the substrate. If it is desirable to use the diode as an avalanche diode, the thickness of the epitaxial layer is chosen to be smaller so that the depletion layer can reach the substrate and the breakdown voltage is determined by the thickness of the epitaxial layer below the schottky electrode layer. Materials other than those mentioned may also be used. For example, the masking layer 3 may consist of silicon nitride, the semiconductor body, for example, of an $A_{III}B_V$ compound, and the schottky electrode layer, for example, of gold or platinum. A semiconductor device according to the invention need not be a diode but may also be, for example, a transistor the collector junction of which is a schottky junction. Instead of a pressure contact, for example, a supply conductor may be used which is connected to the schottky electrode layer by thermal compression bonding.

What is claimed is:

1. A semiconductor device having a schottky junction comprising a semiconductor body of one conductivity type having a region which has a cavity which extends from within said region to the surface of said region, a masking layer on said surface provided with a window at said cavity, said cavity extending laterally to below said masking layer whereby the edge of said masking layer overhangs said cavity, a schottky electrode layer having a thickness smaller than the depth of said cavity and located entirely in said cavity on said region and extending below said masking layer but not up to said masking layer and means for making electrical contact with said schottky electrode layer comprising an electrical conducting member extending into said cavity and forming a contact to said schottky electrode layer.

2. A semiconductor device as claimed in claim 1, wherein a conductive layer which is insulated from the schottky electrode layer by the masking layer is provided on the masking layer.

3. A semiconductor device as claimed in claim 1, wherein the depth of the cavity exceeds 1 $\mu$m and the thickness of the schottky electrode layer is smaller than 1 $\mu$m.

4. A semiconductor device as claimed in claim 1, wherein said region is an epitaxial semiconductor layer of said conductivity type having a higher resistivity than the adjoining part of said semiconductor body.

* * * * *